United States Patent
Burrell et al.

(10) Patent No.: US 6,908,841 B2
(45) Date of Patent: Jun. 21, 2005

(54) SUPPORT STRUCTURES FOR WIREBOND REGIONS OF CONTACT PADS OVER LOW MODULUS MATERIALS

(75) Inventors: Lloyd G. Burrell, Poughkeepsie, NY (US); Douglas Kemerer, Essex Junction, VT (US); Henry A. Nye, III, Brookfield, CT (US); Hans-Joachim Barth, Munich (DE); Emmanuel F. Crabbe, Chappaqua, NY (US); David Anderson, Gulf Shores, AL (US); Joseph Chan, Fishkill, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/251,453

(22) Filed: Sep. 20, 2002

(65) Prior Publication Data

US 2004/0058520 A1 Mar. 25, 2004

(51) Int. Cl.[7] .............................................. H01L 21/44
(52) U.S. Cl. .................................................... 438/612
(58) Field of Search ............................ 438/612, 617, 438/637, 638, 622, 624, 926

(56) References Cited

U.S. PATENT DOCUMENTS

| 5,066,999 | A |   | 11/1991 | Casper |        |
|-----------|---|---|---------|--------|--------|
| 5,249,450 | A |   | 10/1993 | Wood et al. | |
| 5,502,337 | A | * | 3/1996  | Nozaki ......................... 257/773 |
| 5,709,336 | A |   | 1/1998  | Ingraham et al. | |
| 5,847,466 | A | * | 12/1998 | Ito et al. ...................... 257/775 |
| 6,037,668 | A | * | 3/2000  | Cave et al. .................. 257/784 |
| 6,100,573 | A | * | 8/2000  | Lu et al. ...................... 257/508 |
| 6,100,589 | A | * | 8/2000  | Tanaka ....................... 257/758 |
| 6,124,198 | A | * | 9/2000  | Moslehi ...................... 438/622 |
| 6,136,620 | A |   | 10/2000 | Chittipeddi et al. | |
| 6,143,396 | A |   | 11/2000 | Saran et al. | |
| 6,198,170 | B1 | * | 3/2001 | Zhao .......................... 257/784 |
| 6,232,662 | B1 |   | 5/2001 | Saran | |
| 6,245,658 | B1 | * | 6/2001 | Buynoski ..................... 438/619 |
| 6,291,331 | B1 | * | 9/2001 | Wang et al. ................. 438/618 |
| 6,300,688 | B1 | * | 10/2001 | Wong ........................... 257/786 |
| 6,313,024 | B1 |   | 11/2001 | Cave et al. | |
| 6,313,537 | B1 | * | 11/2001 | Lee et al. .................... 257/758 |
| 6,448,641 | B2 | * | 9/2002 | Ker et al. .................... 257/700 |
| 6,455,943 | B1 | * | 9/2002 | Sheu et al. .................. 257/786 |
| 6,495,917 | B1 |   | 12/2002 | Ellis-Monaghan et al. | |
| 6,521,975 | B1 | * | 2/2003 | West et al. .................. 257/620 |
| 6,599,823 | B1 | * | 7/2003 | Lin .............................. 438/618 |
| 6,625,882 | B1 |   | 9/2003 | Saran et al. | |
| 2002/0047218 | A1 | | 4/2002 | Liu et al. | |
| 2002/0089062 | A1 | | 7/2002 | Saran et al. | |
| 2002/0187634 | A1 | | 12/2002 | Saran et al. | |

FOREIGN PATENT DOCUMENTS

| DE | 101 10566 A1 | 9/2001 |
| EP | 0 875 934 A2 | 11/1998 |
| EP | 0 973 198 A2 | 1/2000 |
| JP | 2001267323 | 9/2001 |

\* cited by examiner

*Primary Examiner*—David A. Zarneke
(74) *Attorney, Agent, or Firm*—Slater & Matsil, L.L.P.

(57) ABSTRACT

A semiconductor device (200) having support structures (218, 226, 236) beneath wirebond regions (214) of contact pads (204) and a method of forming same. Low modulus dielectric layers (216, 222, 232) are disposed over a workpiece (212). Support structures (218, 226, 236) are formed in the low modulus dielectric layers (216, 222, 232), and support vias (224, 234) are formed between the support structures (218, 226, 236). A high modulus dielectric film (220, 230) is disposed between each low modulus dielectric layer (216, 222, 232), and a high modulus dielectric layer (256) is disposed over the top low modulus dielectric layer (232). Contact pads (204) are formed in the high modulus dielectric layer (256). Each support via (234) within the low modulus dielectric layer (232) resides directly above a support via (224) in the underlying low modulus dielectric layer (222), to form a plurality of via support stacks within the low modulus dielectric layers (216, 222, 232).

36 Claims, 5 Drawing Sheets

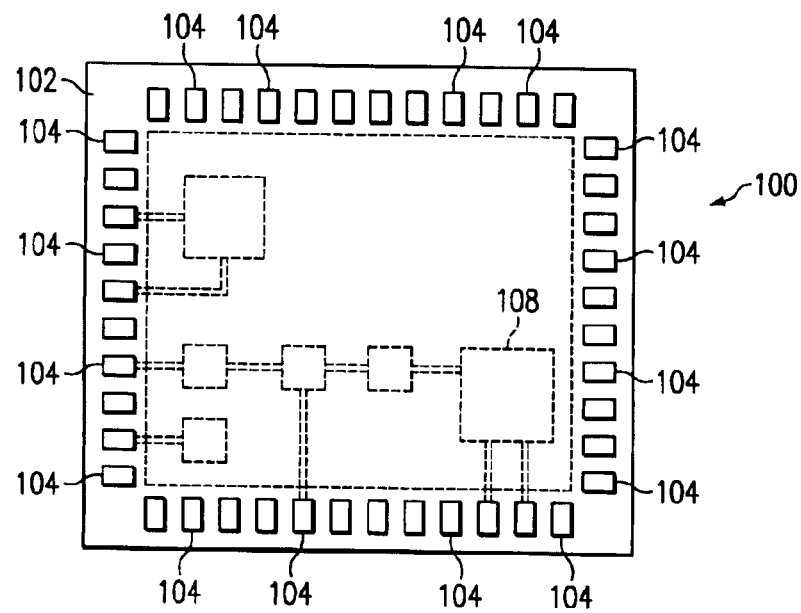
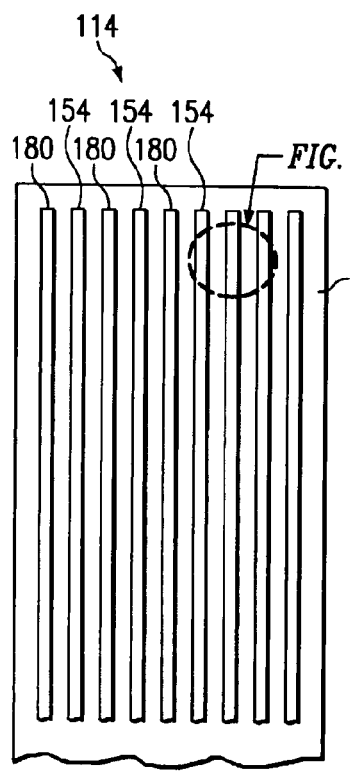
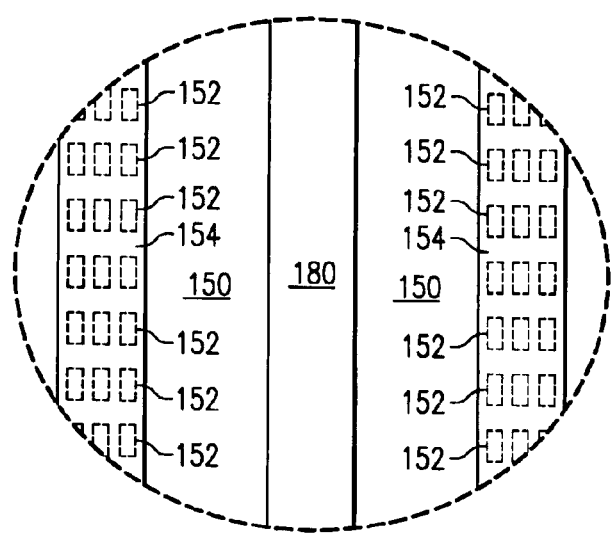
FIG. 1
FIG. 3A
FIG. 3B

SUPPORT STRUCTURES FOR WIREBOND REGIONS OF CONTACT PADS OVER LOW MODULUS MATERIALS

TECHNICAL FIELD

The present invention relates generally to semiconductor devices, and more particularly to a structure and method of providing mechanical support for contact pads of integrated circuits.

BACKGROUND OF THE INVENTION

Semiconductor devices are used in integrated circuits for a wide variety of electronics applications, such as televisions, radios and cellular phones, as examples. There is a trend in the electronics industry towards miniaturization of electronic components, so that electronic devices can be made smaller and lighter. Integrated circuits may comprise multiple levels of metallization for interconnections, and multiple layers of dielectric and semiconductor materials. These layers are patterned using lithography to form conductive lines, transistors, and other elements of integrated circuits.

For a long time, silicon dioxide has been commonly used as a dielectric to isolate conductive lines and various components within the various layers. More recently, low-K materials (e.g., materials having a low dielectric constant K) are being used as insulators in semiconductor devices. Using low-k materials provides the benefit of reduced RC time constants of the metallization layers and lower cross-talk, leading to faster speeds and smaller devices.

However, low-K dielectric materials typically have a low modulus and are structurally weak compared to silicon dioxide. The modulus of a material refers to the Young's modulus or elastic modulus, which is a constant for any given material up to its elastic stress limit. The elastic modulus of a material indicates the linear deflection of a material under normal stress, and the modulus is represented by a ratio of this normal stress to linear strain. Low modulus dielectric materials strain and deform easily, thus providing less structural stability for metallization embedded in the low-k dielectric.

An integrated circuit chip or die includes contact pads that are wirebonded, typically using gold wire, to contacts of a package to allow electrical connection to the die when the IC is packaged. Wirebonding typically comprises a welding process, wherein heat is applied to the contact pads and wires to ensure a good connection. Some welding processes include an ultrasonic process that vibrates the wire laterally being bonded to the contact pad, and also applies a downward pressure against the contact pad.

Wirebonding contact pads having low-K dielectric materials disposed beneath the pads is problematic. In the wirebond process, some of the welding stress is transmitted down into the structure of the die below the contact pad. This mechanical stress from the wirebond welding process can damage the contact pads and underlying structures, and cause the contact pads to lift or tear from the silicon substrate, destroying the semiconductor device and decreasing yields. Because low-K materials have a low modulus and are structurally weak, the die is more susceptible to welding damage, resulting in high levels of mechanical failure due to lifts and tears of the contact pads.

SUMMARY OF THE INVENTION

The present invention achieves technical advantages as a structure and method of providing support beneath the contact pads of integrated circuits. Support structures are disposed within metallization layers, and a plurality of support vias is placed between support structures in the various low modulus material layers. The support vias preferably run the entire thickness of the low modulus material layers, and provide increased mechanical support for the contact pad wirebond region. The support structures may comprise conductive lines arranged unidirectionally or orthogonal to one another within adjacent low modulus material layers. Alternatively, the support structures may comprise a plurality of discrete support pads arranged in a grid, circular, or other repeating pattern.

In one embodiment, a semiconductor device includes a workpiece having a contact pad region, with at least one integrated circuit being formed within the workpiece, and a plurality of contact pads being formed within the contact pad region. At least one contact pad is coupled to a signal of the at least one integrated circuit. A first metallization layer is disposed over the workpiece, the first metallization layer including a plurality of first support structures beneath at least the bond portion of the contact pads. A first dielectric layer is disposed between at least the first support structures. A second metallization layer is disposed over the first vias, the second metallization layer including a plurality of second support structures beneath at least the bond portion of the contact pads. A plurality of first support vias is coupled between the top surface of each first support structure and the bottom surface of an overlying second support structure. A first low modulus dielectric layer is disposed between the first support vias and the second support structures. A high modulus dielectric layer is disposed over the first low modulus dielectric layer. The plurality of contact pads is disposed over the high modulus dielectric layer, each contact pad having a bond portion.

In another embodiment, a semiconductor device includes a workpiece having a contact pad region. At least one integrated circuit is formed within the workpiece. The contact pad region includes a plurality of contact pads each having a bond portion, at least one of the contact pads being coupled to an integrated circuit. A plurality of low modulus dielectric layers is disposed over the workpiece. A plurality of metallization layers are formed within the low modulus dielectric layers. Each metallization layer includes a plurality of support structures beneath at least the bond portion of the contact pads. A plurality of support vias are coupled between each support structure of adjacent metallization layers. A high modulus dielectric film is disposed over the low modulus dielectric layers. A first high modulus dielectric layer is disposed over the top low modulus dielectric layer. At least one contact pad is disposed over the first high modulus dielectric layer in the contact pad region. The support vias within the low modulus dielectric layer reside directly above support vias in each underlying low modulus dielectric layer, forming a plurality of via support stacks within the low modulus dielectric layers.

In yet another embodiment, a method of forming a semiconductor device is disclosed. The method includes providing a workpiece comprising a contact pad region, at least one integrated circuit being formed within the workpiece. A plurality of low modulus dielectric layers are formed over the workpiece, and a plurality of support vias are formed within the low modulus dielectric layers, the support vias having a bottom end and a top end. A plurality of support structures are formed within each low modulus dielectric layer in at least the contact pad region, the support structures being coupled to the top ends of the support vias, wherein the bottom ends of the support vias are coupled to support structures in an underlying low modulus dielectric layer. A high modulus dielectric layer is disposed over the top low modulus dielectric layer, and at least one contact pad is formed in the contact pad region within the high modulus dielectric layer.

Advantages of the invention include providing a structural support within low-modulus material layers beneath the wirebond region of contact pads, decreasing the chance of damaging the die during the wirebonding process and increasing yields. The support structures may be coupled to integrated circuits of the semiconductor device and may function as signal lines or power distribution busses. Interconnect lines for the integrated circuits also may be run between adjacent support structures within each low modulus dielectric layer. Support vias coupled between support structures in adjacent low modulus dielectric layers may be positioned directly over one another, forming a via support stack for exceptional mechanical support under the contact pads.

BRIEF DESCRIPTION OF THE DRAWINGS

The above features of the present invention will be more clearly understood from consideration of the following descriptions in connection with accompanying drawings in which:

FIG. 1 illustrates a top view of a semiconductor device having contact pad regions;

FIG. 3 shows a top view of the unidirectional support structure embodiment shown in FIG. 2;

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Preferred embodiments of the present invention will be discussed, followed by a discussion of the advantages thereof.

FIG. 1 illustrates a top view of a semiconductor device 100 in accordance with embodiments of the present invention that comprises at least one contact pad region 102. The contact pad region 102 contains a plurality of contact pads 104 located at the top surface of the semiconductor device 100. The contact pad region 102 may be located at the perimeter or edge of the semiconductor device 100, as shown; however, alternatively, the contact pad region 102 may comprise other areas of the semiconductor device 100, such as the central region, as an example. The device 100 includes one or more integrated circuits 108 formed therein, in underlying layers, for example.

In accordance with embodiments of the invention, two or more layers of support structures are formed within the low modulus, low-K material layers of the semiconductor device beneath at least the wirebond area of the contact pads. A plurality of support vias is formed between the low-K material layers, between the support structures. The support structures and support vias provide mechanical support in the vertical direction for the contact pads. The support structures may comprise unidirectional conductive lines, orthogonal conductive lines, or discrete support pads, to be described further herein.

Figure 2:
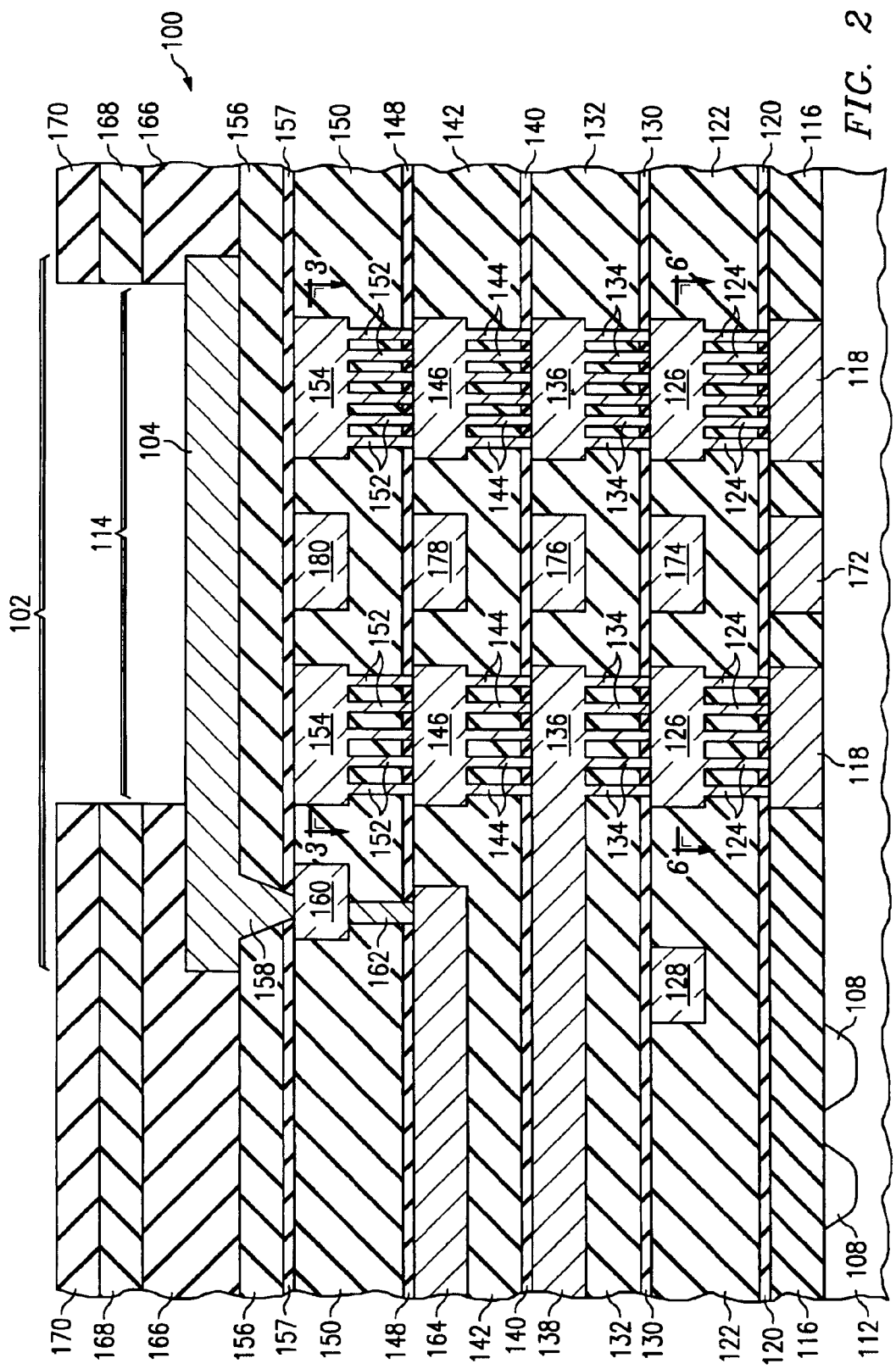
FIG. 2 shows a cross-sectional view of an embodiment of the present invention having unidirectional support structures and support vias within each low-K material layer beneath the wirebond region of the contact pad.

FIG. 2 shows a cross-sectional view of an embodiment of the present invention, in which unidirectional support structures are disposed within each low modulus low-K material layer, with support vias being disposed between the support structures in adjacent low modulus dielectric layers, beneath the wirebond region of the contact pad. The semiconductor device 100 includes a semiconductor wafer workpiece 112 comprising a substrate. The workpiece 112 includes contact pad regions 102 in which contact pads 104 will be formed. The workpiece 112 preferably comprises a semiconductor wafer comprising single-crystal silicon. The workpiece 112 may alternatively comprise other semiconductors such as GaAs, InP, Si/Ge, SiC, or other compound semiconductors, as examples. Non-semiconductor substrates such as quartz, sapphire or printed circuit board materials may alternatively be used.

The workpiece 112 preferably comprises one or more integrated circuits 108 formed therein. The integrated circuits 108 may be formed outside of the contact pad region 102, or in accordance with embodiments of the present invention, the integrated circuits 108 may also be formed in the contact pad region 102, to be described further herein. The workpiece 112 may also include other conductive layers or other semiconductor elements such as transistors or diodes, as examples, that comprise the integrated circuits 108. The integrated circuits 108 may comprise logic circuits or memory devices, as examples.

Each contact pad 104 includes a wirebond region 114 comprising the available area of the contact pad 104 for bonding to a wire. The wirebond region 114 is also referred to herein as the bond portion of the contact pad 104. The contact pad bond portion 114 is later used to weld or connect a wire or other connecting device, such as a ribbon, for example, to a contact on an integrated circuit package (not shown). The contact pad 104 may be about 65 μm wide and 65–130 μm long, for example. The contact pad bond portion 114 may have an approximate width of 60 μm and a length of 60–120 μm, as examples. A dielectric 170 will later be disposed around the upper perimeter of the contact pad 104, making the contact pad perimeter unavailable for bonding, for example.

A first dielectric material layer 116 is formed over the workpiece 112. The first dielectric material layer 116 preferably comprises a low-K material, and may alternatively comprise other dielectric materials having a high modulus, for example. When the first dielectric material layer 116 comprises a low-K material, the low-K material preferably comprises a material having a dielectric constant less than that of silicon dioxide, for example. The low-K materials described herein have a low structural strength and a low elastic modulus. A low modulus dielectric material is defined herein as a dielectric material having a modulus of about 20 GPa or less. The first dielectric material 116 is preferably about 0.1 to 0.4 μm thick, for example.

A high modulus dielectric film (not shown) is formed over the first dielectric material layer 116. The high modulus dielectric film is preferably thin, e.g. 200 Angstroms, and preferably comprises a dielectric such as silicon carbide, an oxide or nitride, or a bi-layer of two materials, as example. The high modulus dielectric film may comprise silicon nitride, for example. A high modulus dielectric material is defined herein as a dielectric material having a modulus of approximately 30 GPa or greater. The high modulus dielectric film functions as an etch stop and protective buffer when forming the support structures 118, to be described further herein.

A plurality of first support structures 118 is formed within the first dielectric material layer 116 and high modulus dielectric film. The first support structures 118 are preferably formed within a first metallization layer, e.g., along with interconnects for other regions of the semiconductor device 100. Interconnects for the integrated circuits 108 may be formed at the same time the support structures 118 are formed (not shown), for example.

Preferably, the first support structures 118 are formed using a single damascene process. In a damascene process, the dielectric layer 116 and high modulus dielectric film (not shown) are patterned using lithography and are etched to remove unpatterned portions. A conductive material is used to fill the spaces within the patterned first dielectric material 116 to form the support structures 118. A chemical-mechanical polish (CMP) process is then used to remove any excess conductive material from the top surface of the high modulus dielectric film. The high modulus dielectric film acts as a buffer to prevent erosion of dielectric material layer 116 in the CMP process.

The support structures 118 are formed in at least the wirebond region 114 of the contact pads, and the first support structures 118 have a top surface. In this embodiment, the support structures 118 comprise a plurality of discrete unidirectional first conductive lines running parallel to one another in a first direction along either the entire length or width of the contact pad wirebond region 114. The conductive lines 118 may be approximately 2.25× 60–100 μm, and may comprise other dimensions depending on the ground rules and feature size of the semiconductor device 100, for example.

A high modulus dielectric film 120 is formed over the high modulus dielectric film on the first dielectric material layer 116 and over the top surface of the support structures 118. The high modulus dielectric film 120 is referred to herein as a first high modulus dielectric film 120. The high modulus dielectric film 120 is preferably thin, e.g. 200 Angstroms, and preferably comprises a dielectric such as silicon carbide, an oxide or nitride, or a bi-layer of two materials, as example. The high modulus dielectric film 120 may comprise silicon nitride, for example.

A first low-K material layer 122 is formed over the first high modulus dielectric film 120. The first low-K material layer 122 preferably comprises a material having a dielectric constant less than that of silicon dioxide, for example. The thickness of the first low-K material layer 122 is preferably greater than the thickness of the first dielectric material layer 116. For example, the first low-K material layer 122 is preferably about 0.1 to 0.7 μm thick.

A plurality of first support vias 124 is formed within the first low-K material layer 122 over each first support structure 118. The term "support via" is defined herein as a portion of conductive material disposed within a dielectric layer of a semiconductor device for mechanical support. A support via can, but is not required, to also provide an electrical connection between a conductive layer with an underlying or overlying adjacent conductive layer.

The first support vias 124 make mechanical and electrical contact with the top surface of the first support structures 118. The thin high modulus dielectric film 120 is preferably removed in the support via 124 regions to enable the support vias 124 to make contact with the underlying support structures 118, for example. The first support vias 124 preferably comprise a material the same as or similar to the material of the first support structures 118. In accordance with embodiments of the invention, the support vias 124 are preferably small, e.g., comprising a minimum feature size, such as 0.2–0.5 μm, and the support vias 124 are preferably spaced apart by the minimum feature,size. The vias 124 may be 0.3 μm tall, e.g., in the vertical direction, as an example. The support vias 124 may comprise a number of shapes, and may comprise via bars comprising a minimum feature size in the width direction and longer than the minimum feature size in the length direction, for example.

A plurality of second support structures 126 is formed within the first low-K material layer 122 over the first support vias 124. The second support structures 126 preferably comprise a material the same as the material of the first support vias 124. Each second support structure 126 makes contact with a plurality of the underlying first support vias 124. The second support structures 126 may be formed in a second metallization layer; for example, interconnect lines 128 may be formed in the same processing step the second support structures 126 are formed in. The second support structures 126 are preferably disposed directly above the first support structures 118, for example. In this embodiment, the second support structures 126 comprise a plurality of discrete unidirectional second conductive lines running parallel to one another in the first direction (e.g., the same direction as the first support structures 118) along either the entire length or width of the contact pad wirebond region 114. The conductive lines 126 may be approximately 2.24 μm×60 to 100 μm, and may comprise other dimensions depending on the ground rules and feature size, for example.

Preferably, a dual damascene process may be used to form the first support vias 124 and second support structures 126. In a dual damascene process, the low-K material layer 122 is deposited over the first high modulus dielectric layer 120, and the low-K material layer 122 is patterned with the support via pattern. Another lithography process is used to pattern the low-K material layer 122 with the second support structure pattern. The thin high modulus dielectric layer 120 functions as an etch stop during the patterning of the low-K material layer 122, preventing corrosion and over-etching of the underlying metal support structures 118. The exposed thin high modulus dielectric layer 120 in the support via region is removed, preferably using the same mask used to pattern the support vias 124, for example. The patterned areas of the low-K material layer 122 are filled with a conductive material to form the first support vias 124 and second support structures 126 simultaneously. A chemical-mechanical polish (CMP) process is then used to remove excess conductive material from the top surface of the low-K material layer 122, for example. Prior to patterning the low-K material layer 122, a thin high modulus dielectric layer (not shown) is preferably formed over the low-K material layer 122 to act a protective buffer during the removal of the excess conductive material.

Alternatively, forming a plurality of first support vias 124 may comprise a single damascene process, and forming a plurality of second support structures 126 comprise a single damascene process, for example. A non-damascene process may also be used to form the first support vias 124 and second support structures 126. For example, the vias 124 may be formed and a low-K material layer 122 deposited thereon. The support structures 126 may then be formed, followed by the formation of the remainder of the low-K material layer 122.

A plurality of low modulus, low-K material layers 132/142/150 may be disposed over the first low-K material layer 122. FIG. 2 depicts a total of four low-K material layers 122/132/142/150, as an example, although the number of low-K material layers preferably ranges from one to six or more, in accordance with embodiments of the present invention. The number of low-K material layers is dependent upon the number of metallization layers required for the semiconductor device 100, for example.

Within each low-K material layer 132/142/150, a plurality of support vias 134/144/152 is formed that are coupled between adjacent support structures in adjacent metallization layers. Support structures 136/146/154 are formed within the low-K material layers 132/142/150 over the support vias 134/144/152, as shown.

A high modulus dielectric film 130/140/148 may be disposed above and below the low-K material layers 122/132/142/150. Each high modulus dielectric film 120/130/140/148 may comprise a bi-layer, with a first layer being formed over the low-K material layer prior to patterning, and a second layer being formed over the low-K material layer and support structure after a CMP step to remove excess conductive material. The high modulus dielectric films 120/130/148/157 act as an etch stop and provide structural support during CMP after dual damascene fills, for example.

Preferred and alternative materials for the elements will next be described. The low-K material layers 122/132/142/150 preferably comprise a polymer or spin-on material, such as Silk™, and alternatively may comprise porous hydrocarbon/polymer, carbon doped oxides, polyimides, or hydrogen silsequioxanes, as examples. The support vias 124/134/144/152 and support structures 118/126/136/146/154 preferably comprise a metal such as copper, and may alternatively comprise aluminum, tungsten, other conductive materials, or combinations of metals, as examples. The support vias 124/134/144/152 and support structures 118/126/136/146/154 may be formed by an electroplating process, for example, which is particularly beneficial if copper is used for the support vias and structures. The thin high modulus dielectric films 120/130/140/148 preferably comprise an oxide or nitride, and more preferably comprise about 200 Angstroms of silicon nitride. Alternatively, the thin high modulus dielectric films may comprise silicon carbide, nitrogen doped silicon carbide, or TEOS (tetraethyl orthosilicate), as examples. The interconnect lines 172/174/176/178/180/138/164/160 and vias 162 preferably comprise a metal such as copper, and may alternatively comprise aluminum, tungsten, other conductive materials, or combinations of metals, as examples.

Preferably, the support vias 134/144/152 are disposed immediately above the underlying support vias 124/134/144, respectively, to form a plurality of via support stacks that extend completely through the low-K material layers 122/132/142/150 and high modulus dielectric films 120/130/140/148. The via support stacks provide improved support beneath the contact pad 104 in at least the wirebond region 114. Alternatively, the support vias 134/144/152 may be staggered or not aligned with underlying support vias 124/134/144, for example.

In one embodiment, optional conductive lines 172 may be disposed between or interleaved between adjacent support structures 118 within low-K material layer 116. Similarly, optional conductive lines 174/176/178/180 may be disposed between adjacent support structures 126/136/146/154, respectively, within low-K material layers 122/132/142/150, respectively. The conductive lines 172/174/176/178/180 may be coupled to interconnect vias or lines elsewhere along the length of the lines (not shown), to connect to a signal line of an integrated circuit 108 in the workpiece 112, for example.

Furthermore, the support structures 136 may be coupled to interconnect lines 138 that run from the contact pad region 102 to couple to an integrated circuit 108 signal line. For example, one or more support structures 126/136/146/154 may be coupled to ground or power, or other signal lines of the semiconductor device 100.

After the fabrication of the metallization layers is complete, a dielectric layer 156 is deposited over the high modulus dielectric film 157, as shown in FIG. 2. The dielectric layer 156 preferably comprises a high modulus dielectric, and has a dielectric constant greater than the dielectric constant of the low-K material layers, for example. The dielectric layer 156 is preferably thicker than the low-K material layers, and may be approximately 0.5 to 2.5 $\mu$m thick, for example. The dielectric layer 156 may comprise a layer of oxide and a layer of nitride, for example, a composite or bi-layer of silicon dioxide and silicon nitride. The dielectric layer 156 may alternatively comprise other dielectric materials. Because the dielectric layer 156 comprises a high modulus, support structures and support vias are not required in this dielectric layer.

Preferably, using a reactive ion etch (RIE) process, for example, a tapered via 158 is formed in the dielectric layer 156. The contact pad 104 is formed preferably by physical vapor deposition (PVD) of a conductive material disposed over dielectric layer 156, as an example. The conductive material is patterned and etched preferably using a subtractive RIE process, to remove the excess conductive material from the field area. The contact pad 104 preferably comprises aluminum and may alternatively comprise other conductors, as examples. Alternatively, contact pad 104 may be formed by a damascene process. Only one via 158 and contact pad 104 are shown, although many vias 158 and contact pads 104 are simultaneously formed in the dielectric layer 156. The via 158 also makes contact through the high modulus dielectric film 157 to the interconnect line 160, as shown. The number of contact pads 104 is dependent upon the required number of input/output (I/O) signals of the semiconductor device 100, for example.

The via 158 is larger than the support vias 124/134/144/152 and may be 2–5 $\mu$m wide, for example. The tapered via 158 is preferably fully landed on the underlying interconnect line 160 within the low-K dielectric layer 150, to prevent ingress of chemicals from subsequent processing down into the structures below, which may cause corrosion or oxidation. The interconnect line 160 may be coupled to an underlying interconnect line 164 in another low-K dielectric layer 142 by a via 162, as shown. Using interconnect lines 160/164 and vias 162/158, the contact pad 104 is coupled to a signal line of an integrated circuit 108.

After the contact pads 104 are formed, an oxide layer 166, comprising silicon dioxide, for example, is deposited over the entire workpiece. A nitride layer 168 is deposited over the oxide layer 166. Layer 168 preferably comprises silicon nitride, and may alternatively comprise other nitride materials, as examples. A polyimide layer 170 is deposited over nitride layer 168. Polyimide layer 170 preferably comprises photosensitive polyimide that is used as a resist to pattern underlying oxide and nitride layers 166 and 168. The photosensitive polyimide is then cured, which hardens the polyimide 170. The polyimide 170 is left remaining over the semiconductor device 100 in regions that will not be wirebonded, and the polyimide acts as a cushion to buffer against stress, for example. Alternatively, the polyimide layer 170 may comprise other dielectric films and polymers, for example. Layers 166, 168 and 170 are opened to expose the wirebond region 114 of the contact pad 104 so that the contact pads 104 may later be wirebonded to a contact of an IC package (not shown).

Only two support structures 118/126/136/146/154 are shown in the wirebond region 114 in FIG. 2; however, there may be many support structures disposed within the wirebond region 114. For example, for a 60×100 μm wirebond region 114, there may be approximately 20 parallel conductive support lines disposed within each low modulus dielectric layer 122/132/142/150, provided for support. Preferably, the total area of the vias comprises at least 7% of the wirebond region area, and more preferably, at least 18% of the wirebond region area, to provide sufficient structural support for the contact pad 104.

FIG. 3 shows a top view of the unidirectional support structure embodiment shown in FIG. 2 at line 3—3 of the top dielectric layer, showing the support structures 154 comprising a plurality of parallel conductive lines. Optional interconnect lines 180 are disposed between each support structure 154, running parallel to the support structures 154. The expanded view in the inset illustrates the plurality of support vias 152 residing below each parallel support conductive line 154. The support vias 152 are shown as having a rectangular shape in FIG. 3; however, the support vias 152 may be square, rounded, elliptical, bar-shaped (e.g. 0.2 μm×2.0 μm), or may comprise other shapes, as examples.

Figure 4:
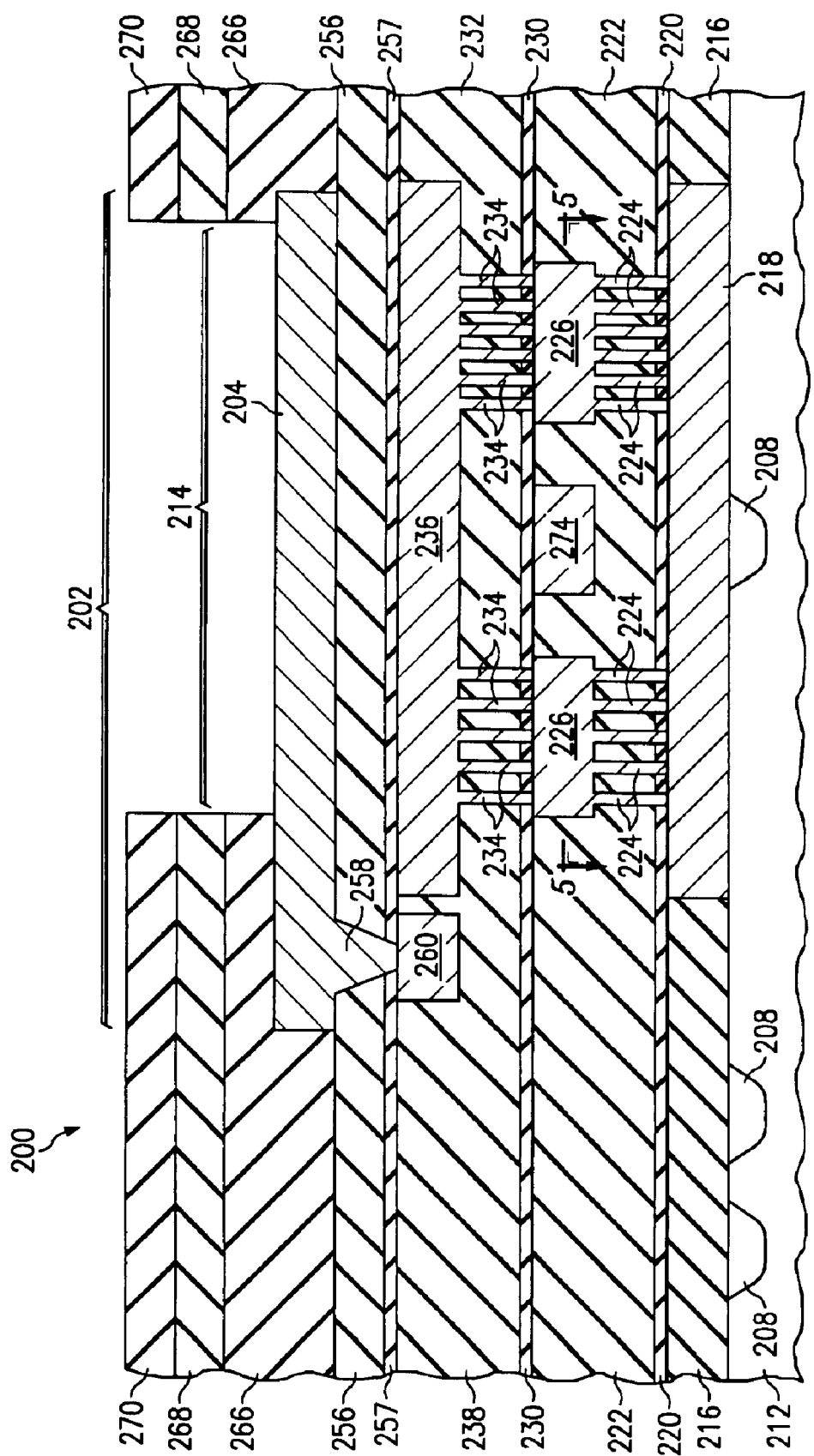
FIG. 4 shows a cross-sectional view of an embodiment of the present invention having orthogonal support structures and support vias in alternating low-K material layers beneath the wirebond region of the contact pad.

FIG. 4 shows a cross-sectional view of another embodiment of the present invention, in which orthogonal support structures 218/226/236 are disposed in alternating low modulus/low-K material layers 216/222/232 beneath the wirebond region 214 of the contact pad 204. A similar process flow and materials may be used to fabricate the semiconductor device 200 as described for the embodiment shown in FIGS. 2 and 3. As in FIG. 2, the bottom dielectric material layer 216 may alternatively comprise a high modulus, high dielectric constant material layer.

While three metallization layers are shown in FIG. 4, the semiconductor device 200 may include more low modulus dielectric layers, but preferably no fewer than one, in accordance with embodiments of the invention. The first support structures 218 comprise a plurality of first conductive lines running parallel to one another in a first direction along either the entire length or width of the contact pad wirebond region 214. The second support structures 226 comprise a plurality of second conductive lines running parallel to one another in a second direction along either the entire width or length of the contact pad wirebond region 214, the second direction being substantially perpendicular to the first direction. A plurality of first support vias 224 is disposed at each intersection of the first and second conductive lines. The first support vias 224 are coupled between the top surface of each first support structure and the bottom surface of an overlying second support structure.

The semiconductor device 200 may further comprise an optional at least one third conductive line 282 (not shown in FIG. 4; see FIG. 5) disposed within the first metallization layer between two adjacent first conductive lines, wherein the third conductive line 282 is coupled to a signal line of an integrated circuit 208 in the workpiece 212 (not shown). The semiconductor device 200 may further comprise an optional at least one fourth conductive line 274 disposed within the second metallization layer between two adjacent second conductive lines 226, wherein the fourth conductive line 274 is coupled elsewhere to a signal line of an integrated circuit 208 (not shown).

High modulus films 220/330 are disposed between adjacent low modulus/low-K material layer. A high modulus dielectric layer 256 is disposed over the top high modulus film 257, and a contact pad 204 and a tapered via 258 are formed in the high modulus layer 256. Dielectric layers 266, 268 and 270 are deposited over the high modulus dielectric layer 256, and layers 266, 268 and 270 are opened to expose the wirebond region 214 of the contact pad 204.

Figure 5A:
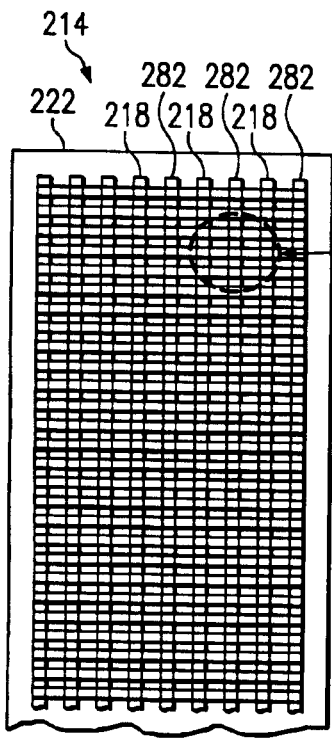
FIG. 5 shows a top view of the orthogonal support structure embodiment shown in FIG. 4.
Figure 5B:
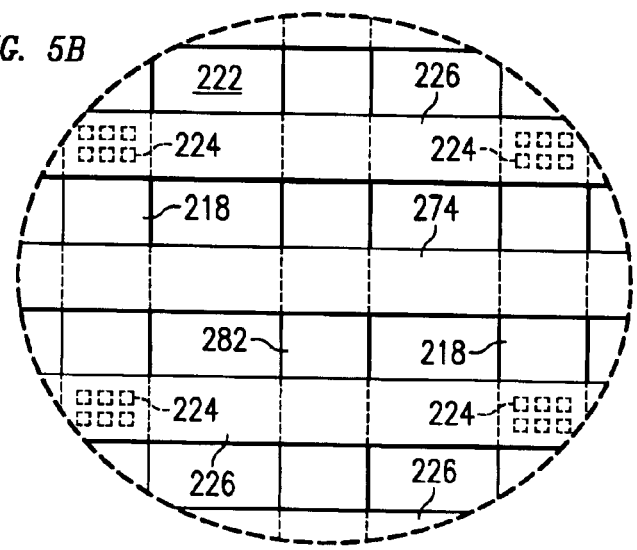

FIG. 5 shows a top view of the orthogonal support structure embodiment shown in FIG. 4 at line 5—5. Support vias 224 are disposed between the metallization layers at the intersection of the support lines 218 and 226. Support vias 224 are preferably not disposed between the metallization layers at the intersection of the optional interconnect lines 274/282, e.g., to prevent shorting of the interconnect lines 274/282 with the support lines 218 or 226.

Figure 6A:
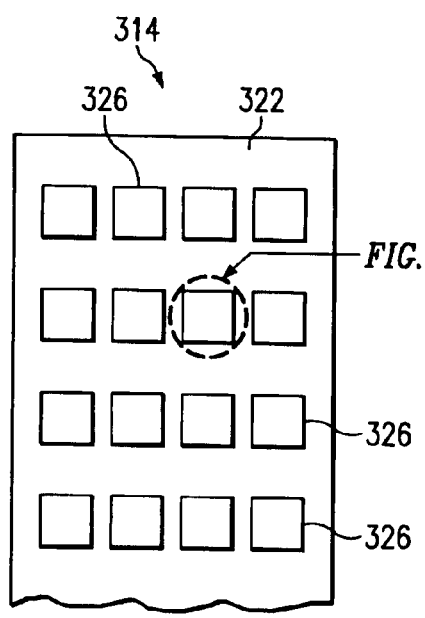
FIG. 6 shows a top view of an embodiment of the present invention having discrete support pads arranged in a grid pattern within each low-K material layer beneath the wirebond region of the contact pad.
Figure 6B:
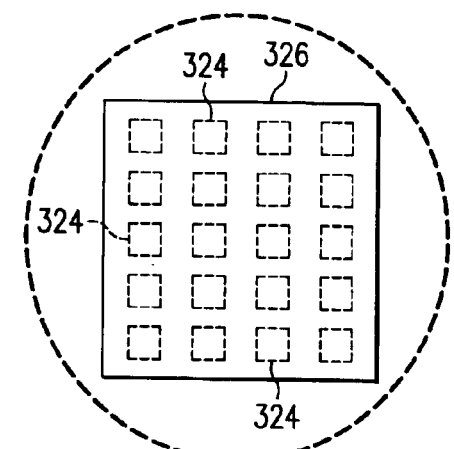

FIG. 6 shows a top view of another embodiment of the present invention wherein the support structures 326 comprise a plurality of discrete support pads within each low-K material layer 322 beneath the wirebond region 314 of the contact pad. Rather than comprising conductive lines that extend the entire length or width of the wirebond region 314 as in the other embodiments, the discrete support pads 326 preferably are substantially rectangular or square shaped as shown in FIG. 6, although the discrete support pads 326 may comprise other shapes, such as circles, or polygons, as examples. The discrete support pads 326 are preferably disposed directly over one another in the various low modulus dielectric layers (not shown in FIG. 6: see the cross-sectional view of FIG. 2). Alternatively, the support structures may be staggered or not aligned. The discrete support pads 326 may comprise a plurality of discrete support pads arranged in a grid, circular, or other repeating pattern, for example. In a preferred embodiment, the support pads 326 comprise dimensions of 2×2 μm to 3×3 μm, for example.

A plurality of support vias 324 are disposed between each adjacent support pad within the low modulus dielectric layer 322, as in the other embodiments described herein. The support vias 324 are preferably aligned with underlying support vias to form a support via stack, although alternatively, the support vias 324 in the dielectric layers may not be aligned. Optionally, at least one of the discrete support pads 326 may be coupled to a signal line of an integrated circuit in the workpiece (not shown). Another option is to dispose a conductive line between two adjacent first support pads, wherein the first conductive line is coupled to a signal line of an integrated circuit in the workpiece (not shown in FIG. 6; see FIG. 2 at line 6—6).

In each embodiment, including unidirectional support structures, orthogonal support structures, and discrete support pads, preferably, support vias reside in 18% or greater of the wirebond region of each contact pad. In particular, the wirebond region comprises an area which equals the wirebond region length×width. Each support via comprises an area that equals the support via length×width. The total of all support via areas within one low modulus dielectric layer in the wirebond region preferably comprises at least 18% of the area of the wirebond region of the contact pads. At a minimum, the total of all support via areas within a low modulus dielectric layer in the wirebond region preferably comprises at least 7% of the area of the wirebond region of the contact pads, in accordance with embodiments of the minimum.

A relationship exists between the percentage of via support area to wirebond region area, and the thickness of the high modulus dielectric layer 156/256. The lower the percentage of via support area, the greater the thickness of the high modulus dielectric layer over the low modulus dielectric material stack is required to be. However, if the high modulus dielectric layer 156/256 is too thick, the aspect ratio of the via 158/258 is large, and a good fill may not be achieved when forming the vias 158/258. If at least 18% of the wirebond region is supported by support vias, then 1–2.5 µm is a sufficient thickness of the high modulus dielectric layer 156/256, for example.

Furthermore, preferably, as described herein, the support vias in each low modulus dielectric layer for each embodiment described herein are aligned positionally, creating a via support stack beneath the wirebond region.

Figure 7:
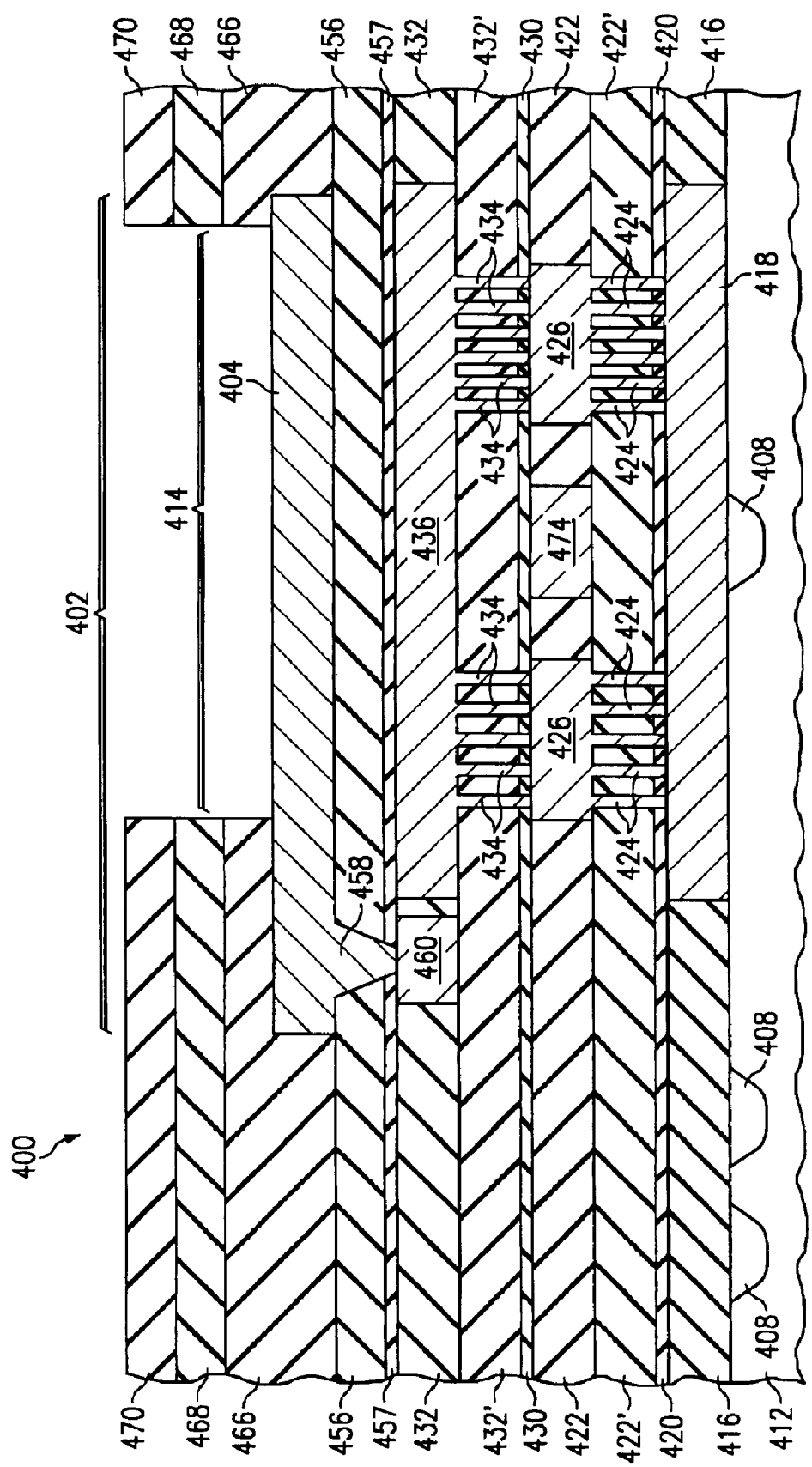
FIG. 7 illustrates a cross-sectional view of an embodiment of the invention wherein the support vias are formed in high modulus material layers.

In one embodiment of the present invention, shown in FIG. 7, the plurality of support vias 424/434 are formed in a high modulus, high dielectric material layer 422'/432'. The device 400 shown in FIG. 7 is formed using similar processes and materials as shown in FIG. 4, for example. The support structures 418/426/436 may comprise unidirectional conductive lines, orthogonal conductive lines or discrete support pads, as described for other embodiments herein.

The high modulus dielectric layers 422' and 432' preferably comprise silicon carbide, oxides or nitrides, or a combination thereof, for example. Support vias 424/434 may be formed in a single damascene process. Alternatively, support vias and support structures may be formed in a dual damascene process, as described for other embodiments herein. In such a dual damascene process, high modulus dielectric layer 422' is deposited over thin high modulus film 420, and low modulus dielectric layer 422 is deposited over the high modulus dielectric layer 422'. A first portion of thin high modulus layer 430 is deposited over the low modulus dielectric layer 422. The dielectric layers 430/422/422' are patterned and etched using two masks, for example, and more than one RIE step, to form the pattern for both support vias 424 and support structures 426. Conductive material is deposited over the dielectric layers 430/422/422', and a CMP process is used to remove excess conductive material from the surface of the device 400, stopping on the thin high modulus film 430. A second portion of thin high modulus layer 430 is deposited over the low modulus dielectric layer 422 and the conductive material prior to depositing other low-K dielectric layers. A similar process is used to A form other support structures and support vias in subsequently deposited low-K dielectric layers.

Another embodiment of the present invention comprises a method of forming a semiconductor device. The method includes providing a workpiece comprising a contact pad region, wherein at least one integrated circuit has been formed within the workpiece. A plurality of low modulus dielectric layers are formed over the workpiece, and a plurality of support vias are formed within each low modulus dielectric layer, the support vias having a bottom end and a top end. A plurality of first support structures are within each low modulus dielectric layer in at least the contact pad region, the first support structures being coupled to the top ends of the support vias, wherein the bottom ends of the support vias are coupled to first support structures in an underlying low modulus dielectric layer. A high modulus dielectric layer is formed over the top low modulus dielectric layer, and at least one contact pad is formed in the contact pad region within the high modulus dielectric layer.

In one embodiment, forming the plurality of support structures comprises forming a plurality of conductive lines running parallel to one another in a first direction along at least the length of the contact pad wirebond region. At least one of the conductive lines may be coupled to a signal line of an integrated circuit in the workpiece. A signal-conducting line may be formed within at least one metallization layer between two adjacent conductive lines, wherein the signal-conducting line is coupled to a signal line of an integrated circuit in the workpiece.

In another embodiment, forming the support structures comprises forming support structures in odd alternating low modulus dielectric layers by disposing a plurality of first conductive lines parallel to one another in a first direction along at least the length of the contact pad wirebond region. Forming support structures in even alternating low modulus dielectric layers comprises disposing a plurality of second conductive lines parallel to one another in a second direction along at least the width of the contact pad wirebond region, the second direction being substantially perpendicular to the first direction. Preferably, forming the support vias comprises disposing the support vias at the intersection of the first and second conductive lines. A signal-conducting line may be disposed within at least one metallization layer between two adjacent first and/or second conductive lines. The signal-conducting line may be coupled to a signal line of an integrated circuit in the workpiece.

In yet another embodiment, forming the support structures comprises forming a plurality of discrete support pads. At least one of the support pads may be coupled to a signal line of an integrated circuit in the workpiece. At least one first conductive line may be disposed between two adjacent support pads within the metallization layer, and the first conductive line may be coupled to a signal line of an integrated circuit in the workpiece.

The method may include disposing a high modulus dielectric film between each two adjacent low modulus dielectric layers, and positioning the plurality of support vias over one another within each low modulus dielectric layer to form a via support stack.

The present invention provides several advantages over prior art contact pad support structures. Because interconnect lines may be run underneath the contact pad, a staggered wirebond pitch may be achieved, which increases the I/O density of the semiconductor device. A structural support is provided within low-modulus material layers beneath the wirebond region of contact pads, reducing damage to the die during the wirebonding process, and thus, increasing yields. The support structures may be used for mechanical support only, or alternatively, the support structures may be coupled to integrated circuits of the semiconductor device and function as signal lines. Because the support structures comprise a plurality of discrete lines or pads, not only may the discrete support lines and pads be coupled to more than one signal, furthermore, interconnect lines may be positioned within each low modulus dielectric layer beneath the wirebond region. The interconnect lines for the integrated circuits also may be interleaved between adjacent support structures within each low modulus dielectric layer. Support vias coupled between support structures in adjacent low modulus dielectric layers may be positioned directly over one another, forming a via support stack for exceptional mechanical support under the contact pads.

Running interconnect lines between the support structures is advantageous because not only is silicon area conserved, additionally, in the unidirectional and orthogonal embodiments, the support structures function as a shield and reduce noise on the interconnect lines. The support structures may be coupled to a ground or other signal of the integrated circuits to further reduce noise. The orthogonal embodiment of the invention provides the flexibility to run conductive lines in more than one direction beneath the wirebond region. Wiring interconnect through the orthogonal support structure prevents line-to-line capacitance coupling.

While the support via and support structures have been described herein as being formed in single or dual damascene processes, alternatively, the support vias and support structures may be made by depositing a conductive material, patterning the conductive material to form the support vias and support structures, and forming the low-K material layers over the conductive material, using conventional metallization layer formation techniques. Furthermore, the invention has been described with reference to low-K dielectric material layers. However, embodiments of the invention have application when low modulus material layers of any type are formed beneath contact pads of a semiconductor device.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of forming a semiconductor device, comprising:
    providing a workpiece comprising a contact pad region having a selected area, at least one integrated circuit being formed within the workpiece;
    forming a plurality of low modulus dielectric layers over the workpiece;
    forming a plurality of support via groups in said contact pad region, and within each low modulus dielectric layer to provide mechanical support to said low modulus dielectric layers, each one of the support via groups comprising at least three vias, and having a bottom end and a top end;
    forming a plurality of support structures within each low modulus dielectric layer in at least the contact pad region, the support structures located at the top ends of the vias and the bottom ends of the vias located over support structures in an adjacent underlying low modulus dielectric layer, and wherein forming the support structures comprises the steps of forming support structures in odd alternating low modulus dielectric layers by disposing a plurality of first conductive lines parallel to one another in a first direction along at least the length of the contact pad bond portion and forming support structures in even alternating low modulus dielectric layers by disposing a plurality of second conductive lines parallel to one another in a second direction alone at least the width of the contact pad bond portion, the second direction being substantially perpendicular to the first direction, wherein forming the support via groups comprises disposing the support vias at the intersection of the first and second conductive lines;
    disposing a high modulus dielectric layer over the top of each low modulus dielectric layer; and
    forming at least one contact pad in the contact pad region within the high modulus dielectric layer.

2. The method according to claim 1, wherein forming a plurality of support via groups and forming a plurality of support structures comprise a single damascene process.

3. The method according to claim 1, wherein forming a plurality of support via groups and forming a plurality of support structures comprise a dual damascene process.

4. The method according to claim 1, further comprising coupling at least one of the conductive lines to a signal line of an integrated circuit in the workpiece.

5. The method according to claim 1, further comprising forming a signal-conducting line within at least one metallization layer between two adjacent conductive lines, wherein the signal-conducting line is coupled to a signal line of an integrated circuit in the workpiece.

6. The method according to claim 1, further comprising disposing a signal-conducting line within at least one metallization layer between two adjacent first or second conductive lines, and coupling the signal-conducting line to a signal line of an integrated circuit in the workpiece.

7. The method according to claim 1, wherein forming the support structures comprises forming a plurality of discrete support pads.

8. The method according to claim 7, further comprising coupling at least one of the support pads to a signal line of an integrated circuit in the workpiece.

9. The method according to claim 7, further comprising disposing at least one conductive line between two adjacent support pads within the metallization layer, wherein the conductive line is coupled to a signal line of an integrated circuit in the workpiece.

10. The method according to claim 1, further comprising positioning the plurality of support via groups over one another within each low modulus dielectric layer to form a via support stack.

11. The method according to claim 10 wherein each low modulus dielectric layer has a thickness of between about 1 $\mu$m and about 2.5 $\mu$m.

12. The method according to claim 1 wherein said high modulus dielectric layer has a thickness of between about 1 $\mu$m and about 2.5 $\mu$m.

13. The method according to claim 1 wherein each low modulus dielectric layer has a thickness of between about 1 $\mu$m and about 2.5 $\mu$m.

14. The method according to claim 1 wherein at least one group of said plurality of groups carries an electrical current.

15. A method of forming a semiconductor device, comprising:
    providing a workpiece comprising a contact pad region having a selected area, at least one integrated circuit being formed within the workpiece;

forming a plurality of low modulus dielectric layers over the workpiece;

forming a plurality of high modulus dielectric layers between each low modulus dielectric layer;

forming a plurality of support via groups in said contact pad region, and within each high modulus dielectric layer, each one of the support via groups comprising at least three vias having a bottom pad and a top end;

forming a plurality of support structures within each low modulus dielectric layer in at least the contact pad region to provide mechanical support to said low modulus dielectric layer, a support structure located at the top ends of at least each via group and the bottom ends of each via group located over a support structure in an adjacent underlying low modulus dielectric layer, and wherein forming the support structures comprises the steps of forming support structures in odd alternating low modulus dielectric layers by disposing a plurality of first conductive lines parallel to one another in a first direction along at least the length of the contact pad bond portion and forming support structures in even alternating low modulus dielectric layers by disposing a plurality of second conductive lines parallel to one another in a second direction along at least the width of the contact pad bond portion, the second direction being substantially perpendicular to the first direction, wherein forming the support via groups comprises disposing the support vias at the intersection of the first and second conductive lines;

disposing a high modulus dielectric layer over each low modulus dielectric layer; and forming at least one contact pad in the contact pad region within the high modulus dielectric layer.

16. The method according to claim 15, wherein forming a plurality of support via groups and forming a plurality of support structures comprise a single damascene process.

17. The method according to claim 15, wherein forming a plurality of support, via groups and forming a plurality of support structures comprise a dual damascene process.

18. The method according to claim 15, further comprising coupling at least one of the conductive lines to a signal line of an integrated circuit in the workpiece.

19. The method according to claim 15, further comprising forming a signal-conducting line within at least one metallization layer between two adjacent conductive lines, wherein the signal-conducting line is coupled to a signal line of an integrated circuit in the workpiece.

20. The method according to claim 15, wherein the support structures comprises forming a plurality of discrete support pads.

21. The method according to claim 20, further comprising coupling at least one of the support pads to a signal line of an integrated circuit in the workpiece.

22. The method according to claim 20, further comprising disposing at least one conductive line between two adjacent support pads within the metallization layer, wherein the conductive line is coupled to a signal line of an integrated circuit in the workpiece.

23. The method according to claim 15, further comprising positioning the plurality of support via groups over one another within each low modulus dielectric layer to form a via support stack.

24. The method according to claim 15 wherein said high modulus dielectric layer has a thickness of between about 1 $\mu$m and about 2.5 $\mu$m.

25. The method of claim 15 wherein at least one group of said plurality of groups carries an electrical current.

26. A method of forming a semiconductor device, comprising:

providing a workpiece comprising a contact pad region having a selected area, at least one integrated circuit being formed within the workpiece;

forming a plurality of low modulus dielectric layers over the workpiece;

forming a plurality of support via groups in said conduct pad region, and within each low modulus dielectric layer to provide support to said low modulus dielectric layers, each one of the support via groups comprising at least three vias, and each via in said plurality of support via groups defining a cross sectional area, and having a bottom end and a top end, the total amount of the cross sectional area of the support vias in each low modulus dielectric layer being at least seven percent (7%) of said selected area of said contact pad region;

forming a plurality of support structures within each low modulus dielectric layer in at least the contact pad region to provide mechanical support to said low modulus dielectric layer, the support structures located at the top ends of the vias and the bottom ends of the vias located over support structures in an adjacent underlying low modulus dielectric layer, and wherein forming the support structures comprises the steps of forming support structures in odd alternating low modulus dielectric layers by disposing a plurality of first conductive lines parallel to one another in a first direction along at least the length of the contact pad bond portion and forming support structures in even alternating low modulus dielectric layers by disposing a plurality of second conductive lines parallel to one another in a second discretion along at least the width of the contact pad bond portion, the second direction being substantially perpendicular to the first direction, wherein forming the support via groups comprises disposing the support vias at the intersection of the first and second conductive lines;

disposing a high modulus dielectric layer over the top low modulus dielectric layer; and forming at least one contact pad in the contact pad region within the high modulus dielectric layer.

27. The method according to claim 26 wherein the total amount of said cross sectional area of said vias is at least eighteen percent (18%) of said selected area of said contact pad region.

28. The method of claim 26 wherein said high modulus dielectric layer has a thickness of between about 1 $\mu$m and about 2.5 $\mu$m.

29. The method according to claim 28 wherein the total amount of said cross sectional area of said vias is at least eighteen percent (18%) of said selected area of said contact pad region.

30. The method of claim 26 further comprising depressing a high modulus dielectric film, between each two adjacent low modulus dielectric layers.

31. The method according to claim 30 wherein the total amount of said cross sectional area of said vias is at least eighteen percent (18%) of said selected area of said contact pad region.

32. The method of claim 26 wherein each low modulus dielectric layer has a thickness of between about 1 $\mu$m and about 2.5 $\mu$m.

33. The method according to claim 32 wherein the total amount of said cross sectional area of said vias is at least eighteen percent (18%) of said selected area of said contact pad region.

34. The method of claim 26 further comprising positioning the plurality of support via groups over one another within each low modulus dielectric layer to form a via support stack.

35. The method according to claim 34 wherein the total amount of said cross sectional area of said vias is at least eighteen percent (18%) of said selected area of said contact pad region.

36. The method of claim 26 wherein at least one group of said plurality of groups carries an electrical current.

* * * * *

UNITED STATES PATENT AND TRADEMARK OFFICE
CERTIFICATE OF CORRECTION

PATENT NO. : 6,908,841 B2
DATED : June 21, 2005
INVENTOR(S) : Burrell et al.

It is certified that error appears in the above-identified patent and that said Letters Patent is hereby corrected as shown below:

Column 16,
Line 6, delete "conduct" and insert -- contact --.

Signed and Sealed this

Sixteenth Day of August, 2005

JON W. DUDAS
*Director of the United States Patent and Trademark Office*